(12) United States Patent
Chang et al.

(10) Patent No.: US 7,221,035 B2
(45) Date of Patent: May 22, 2007

(54) SEMICONDUCTOR STRUCTURE AVOIDING POLY STRINGER FORMATION

(75) Inventors: Julian Chang, Shanghai (CN); YuanWei Zheng, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 282 days.

(21) Appl. No.: 10/967,131

(22) Filed: Oct. 19, 2004

(65) Prior Publication Data

US 2005/0082633 A1 Apr. 21, 2005

(30) Foreign Application Priority Data

Oct. 21, 2003 (CN) .......................... 2003 1 0108057

(51) Int. Cl.
*H01L 29/00* (2006.01)
(52) U.S. Cl. ...................... 257/519; 257/509; 257/506; 257/E21.545; 438/298
(58) Field of Classification Search ................ 257/506, 257/509, 519, 544
See application file for complete search history.

(56) References Cited

U.S. PATENT DOCUMENTS

| | | | | |
|---|---|---|---|---|
| 4,855,800 A | * | 8/1989 | Esquivel et al. | 257/316 |
| 5,045,489 A | * | 9/1991 | Gill et al. | 438/258 |
| 5,173,436 A | * | 12/1992 | Gill et al. | 438/262 |
| 5,844,270 A | * | 12/1998 | Kim et al. | 257/315 |

* cited by examiner

*Primary Examiner*—Jerome Jackson
*Assistant Examiner*—Paul Budd
(74) *Attorney, Agent, or Firm*—Rosenberg, Klein & Lee

(57) ABSTRACT

The present invention discloses a semiconductor structure avoiding the poly stringer formation in semiconductor processing. A semiconductor device is divided into a memory cell area and a peripheral portion. A plurality of parallel first isolation devices are positioned in the semiconductor substrate in the memory cell area. A second isolation device is positioned in the semiconductor substrate in the peripheral portion, and parallel with the first isolation device. A dummy buried doping region is positioned in the semiconductor substrate, and is positioned between the memory cell device and the peripheral portion and parallel with the second isolation device. An oxide area is formed on the dummy buried doping region. The dummy buried doping region and the oxide region can prevent poly string formation during subsequent processing.

10 Claims, 2 Drawing Sheets

SEMICONDUCTOR STRUCTURE AVOIDING POLY STRINGER FORMATION

BACKGROUND OF THE INVENTION

1. Field of the Invention

The present invention relates to a semiconductor structure design, and more particularly relates to a semiconductor structure avoiding poly stringer formation in the mask read only memory process.

2. Description of the Prior Art

Semiconductor devices typically include multiple individual components formed on or within a substrate. Such devices often comprise a high density section and a low density section. For example, a memory device comprises one or more high density core regions and a low density peripheral portion on a single substrate. The memory cell array is positioned in the high density core region.

As the size of the semiconductor structure shrinks, the density of the high density section is relatively raised. However, many problems about the design of the density of the device arise in the process. For example, during the memory cell formation, the etching process of the floating gate of poly I layer is performed to remove the redundant portion. In this moment, since the distance between memory cells is shrunk as the density is raised, poly stringer formation will occur during the etching process. The poly strings are formed due to incomplete removal of the poly I layer of the unmasked portions during the etching process. This phenomenon occurs during the self-aligned etch (SAE) step.

Referring to FIG. 1, a conventional semiconductor device is shown. The semiconductor device is divided into the memory cell area 10 and the peripheral portion 12 by a dotted line A–A'. In the memory cell area 10, the semiconductor substrate 14 comprises a doped area 16 and a local oxidation of silicon (LOCOS) 18 thereon. The oxide layer of the isolation device 18 comprises a gate oxide layer (not shown), a poly I layer 20, an oxide-nitride-oxide (ONO) layer (not shown), and a poly II layer 22 in sequence. In the peripheral portion 12, the semiconductor substrate 14 comprises a shallow trench isolation (STI) structure 24. When the surface of the STI structure 24 is higher than the semiconductor substrate 14, poly stringer is formed during the etching process, causing an electrically short of the memory cell. Therefore, for the high-density semiconductor structure, a solution is needed to avoid or reduce the poly stringer formation.

SUMMARY OF THE INVENTION

The present invention provides a semiconductor structure avoiding poly stringer formation in the semiconductor process, reducing the height difference between the shallow trench isolation (STI) and the active area of memory cell, thereby avoiding the poly stringer formation.

Additionally a dummy buried doping region is formed in the cell edge region, thereby reducing the poly stringer formation.

In accordance with the present invention, a semiconductor substrate is divided into a memory cell area and a peripheral portion. A dummy buried doping region is formed in the semiconductor substrate, and positioned between the memory cell area and the peripheral portion. The dummy buried doping region is adjacent and parallel with a shallow trench isolation device in the peripheral portion. An oxide region is formed on the dummy buried doping region, thereby suppressing poly stringer formation in subsequent processing by the dummy buried doping region and the oxide region.

The buried doping region used as a bit line, is positioned in the memory call area of the semiconductor, so that the dummy buried doping region is parallel with the buried doping region. Also, the dopant dose of the dummy buried doping region is higher than that of the buried doping region used as a bit line.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

The present invention provides a semiconductor structure avoiding the poly stringer formation in the semiconductor process by using a dummy buried doping region and an oxide region thereon, thereby reducing the height difference between the shallow trench isolation (STI) and the active area of the memory cell area in order to accomplish a semiconductor structure avoiding poly stringer formation.

Figure 1:
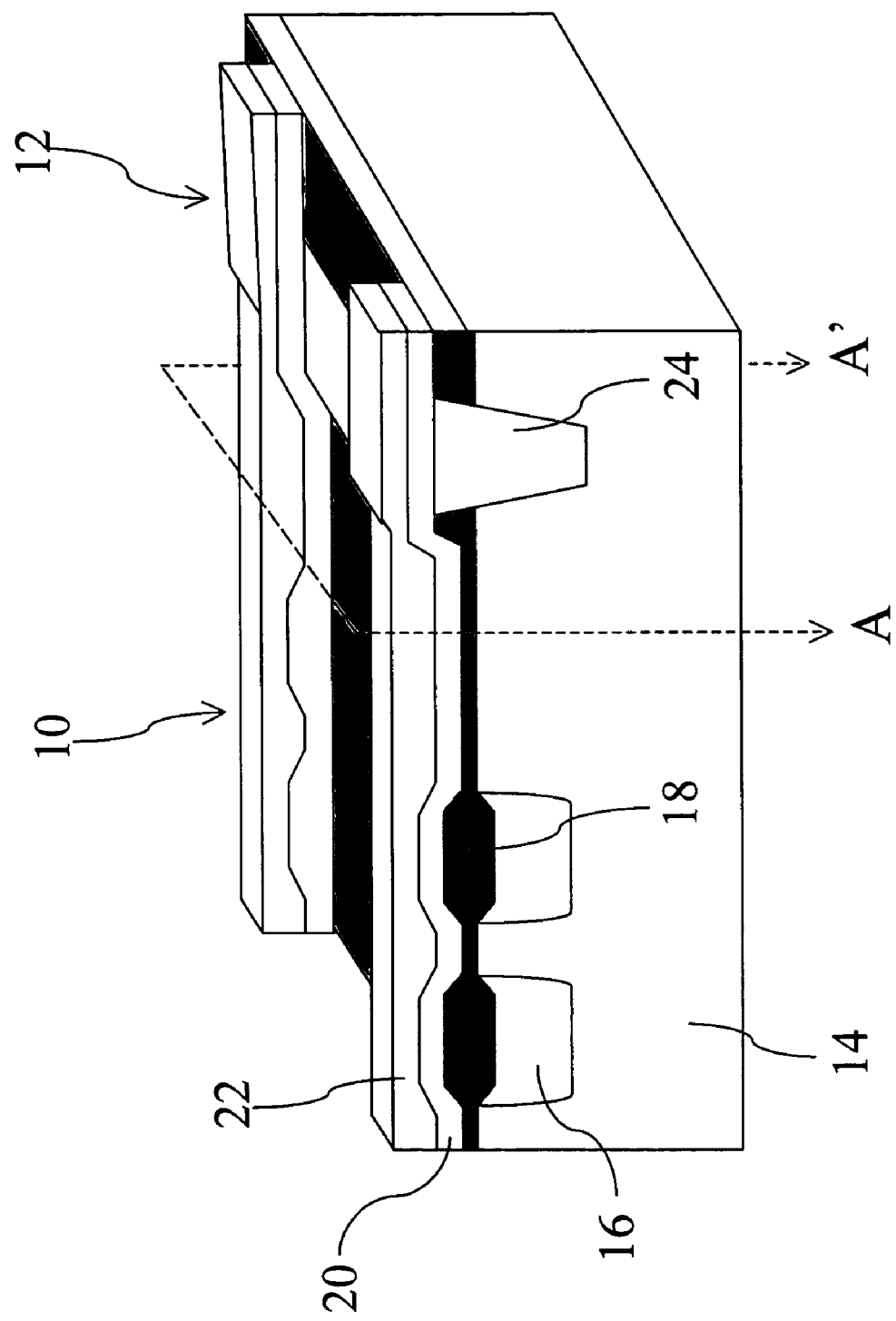
FIG. 1 is a perspective view of a conventional semiconductor device.
Figure 2:
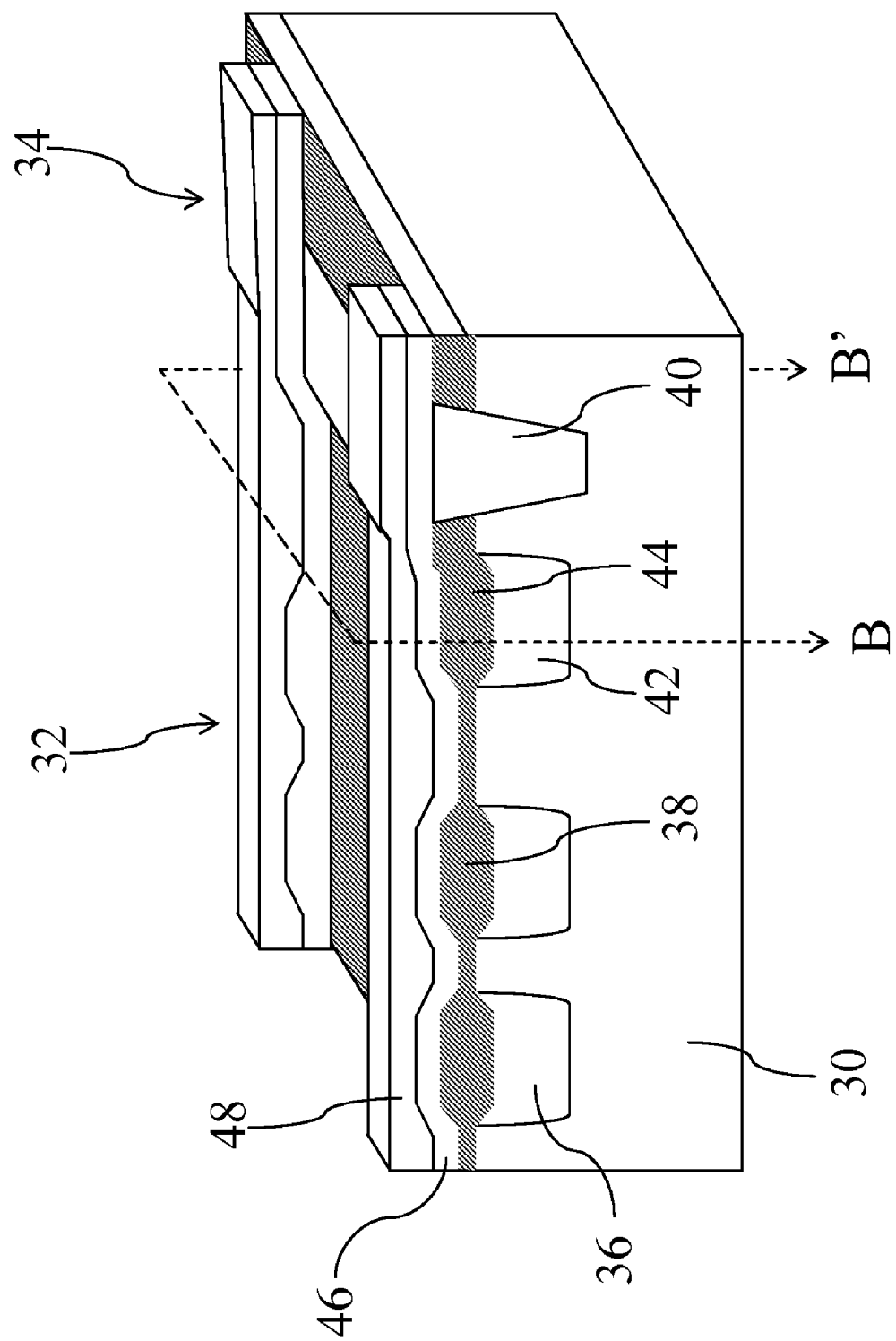
FIG. 2 is a perspective view of a semiconductor device in accordance with an embodiment of the present invention.

Referring to FIG. 2, a perspective view of the semiconductor device according to the present invention is shown. One preferred embodiment of the present invention is applied in the Mask Read Only Memory (MROM) process. A semiconductor substrate 30 of the semiconductor structure comprises a memory cell area 32 and a peripheral portion 34 separated by a dotted line B–B'. In the memory cell area 32, a plurality of buried doping regions 36 are formed in the semiconductor substrate 30 using doping implantation and used as bit lines. An isolation device 38 is formed on each of buried doping regions 36 using Local oxidation of silicon (LOCOS). A shallow trench isolation (STI) device 40 is formed in the peripheral portion 34 of the semiconductor substrate 30.

Next, the dopant, such as N-type dopant, is implanted into the semiconductor substrate 30 along with the cell edge region between the memory cell area 32 and the peripheral portion 34 parallel with the buried doping region 36, forming a dummy buried doping region 42. An oxide region 44 is formed on the dummy buried doping region 42.

In addition, an oxide layer (not shown), a first polysilicon layer 46, an oxide-nitride-oxide (ONO) layer (not shown), and a second polysilicon layer 48 are formed in sequence on the oxide layer of the isolation device 38 and the upper surface of the oxide region 44. The dummy buried doping region 42 is positioned in a vertical direction of the first polysilicon layer 46 and second polysilicon layer 48.

In this embodiment, the dummy buried doping region 42 is long-shaped, and is perpendicular to the first polysilicon layer 46 and second polysilicon layer 48. The dummy buried doping region 42 is parallel with the buried doping region 36 and the isolation device 38 of the memory cell area 32. The continuously long-shaped dummy buried doping region 42 is parallel with the peripheral portion 34 of shallow trench isolation (STI) device 40. Also, for the buried doping region 36 in the memory cell area 32, the dopant dose of the dummy buried doping region 42 is higher, and not used as a buried bit line.

Accordingly, the oxide region 44 can retard the height difference of the cell edge region. This height difference is caused by the top of the peripheral portion 34 of shallow trench isolation (STI) device 40 being higher than the surface of the memory cell area 32. According to the present invention, using the oxide region 44 as a buffer structure, will retard the interface between the cell edge region, such that it will be flatter between the memory cell area 32 and the peripheral portion 34. Therefore, subsequent to the etching of the first polysilicon layer 46 and the second polysilicon layer 48, the poly stringer does not occur due to the height difference between the shallow trench isolation (STI) device 40 and the memory cell area 32.

Finally, conventional lithography is performed to remove a portion of first polysilicon layer 46 and second polysilicon layer 48, thereby forming the floating gate and the control gate of the memory device.

Since the dummy buried doping region 42 is formed in the cell edge region with the oxide region used as a buffer structure, the poly stringer will not occur due to the polysilicon in the memory cell area 32, thereby avoiding or reducing the poly stringer formation.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A semiconductor structure avoiding poly stringer formation in semiconductor processing, said semiconductor structure divided into a memory cell area and a peripheral portion, comprising:
    a semiconductor substrate;
    a dummy buried doping region positioned in the semiconductor substrate, and positioned between the memory cell area and the peripheral portion, and adjacently parallel with a shallow trench isolation device in the peripheral portions, a dopant dose of the dummy buried doping region being higher than that of a buried doping region used as a bit line; and
    an oxide region positioned on the dummy buried doping region.

2. The semiconductor structure of claim 1, wherein the dummy buried doping region is perpendicular to a polysilicon layer in the memory cell area.

3. The semiconductor structure of claim 1, wherein the dummy buried doping region is parallel with the buried doping region used as the bit line in the memory cell area.

4. The semiconductor structure of claim 1, wherein an N-type dopant is doped in the dummy buried doping region.

5. A semiconductor structure avoiding poly stringer formation, said semiconductor structure divided into a memory cell area and a peripheral portion, comprising:
    a semiconductor substrate, wherein a plurality of doping regions are formed in the memory cell area of the semiconductor substrate;
    a plurality of parallel first isolation devices positioned on the semiconductor substrate and covering the doping regions;
    a second isolation device positioned in the semiconductor substrate and the peripheral portion, and parallel with the first isolation devices;
    a polysilicon layer positioned on the memory cell area and the peripheral portion of the semiconductor substrate, the polysilicon layer being perpendicular to the first isolation device;
    a dummy buried doping region positioned in the semiconductor substrate between the memory cell area and the peripheral portion, and adjacently parallel with the second isolation device in the peripheral portion, the dopant dose of the dummy buried doping region being higher than that of the plurality of doping regions; and
    an oxide region positioned on the dummy buried doping region.

6. The semiconductor structure of claim 5, wherein the plurality of doping regions in the semiconductor substrate are used as a buried bit line.

7. The semiconductor structure of claim 5, wherein the oxide region is positioned under the polysilicon layer.

8. The semiconductor structure of claim 5, wherein the first isolation device is formed by local oxidation of silicon (LOCOS).

9. The semiconductor structure of claim 5, wherein the second isolation device is a shallow trench isolation device.

10. The semiconductor structure of claim 5, wherein an N-type dopant is doped in the dummy buried doping region.

* * * * *